United States Patent
Toriumi (10) Patent No.: US 10,782,760 B2
(45) Date of Patent: Sep. 22, 2020

(54) ELECTRONIC DEVICE AND METHOD OF CONTROLLING THE SAME

(71) Applicant: CANON KABUSHIKI KAISHA, Tokyo (JP)

(72) Inventor: Hiroshi Toriumi, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 82 days.

(21) Appl. No.: 15/992,798

(22) Filed: May 30, 2018

(65) Prior Publication Data

US 2018/0348835 A1     Dec. 6, 2018

(30) Foreign Application Priority Data

May 31, 2017  (JP) .................. 2017-108362

(51) Int. Cl.
  *G06F 1/28*     (2006.01)
  *G06F 1/16*     (2006.01)
  (Continued)

(52) U.S. Cl.
  CPC .............. *G06F 1/28* (2013.01); *G06F 1/1643* (2013.01); *G06F 1/181* (2013.01); *G06F 1/189* (2013.01);
  (Continued)

(58) Field of Classification Search
  CPC .......... G06F 1/28; G06F 1/1643; G06F 1/181; G06F 1/189; G06F 1/3209; G06F 1/3287; G06F 13/00; G06F 13/4291; H05K 7/023
  See application file for complete search history.

(56) References Cited

U.S. PATENT DOCUMENTS

2015/0346794 A1* 12/2015 Sakashita ................ G06F 1/266
                                                            713/310

FOREIGN PATENT DOCUMENTS

CN     101989932 A    3/2011
JP     63-231656 A    9/1988
              (Continued)

OTHER PUBLICATIONS

The foreign patent documents were cited in a Jun. 25, 2019 Japanese Office Action, which is enclosed without an English Translation, that issued in Japanese Patent Application No. 2017-108362.
(Continued)

*Primary Examiner* — Henry Tsai
*Assistant Examiner* — John B Roche
(74) *Attorney, Agent, or Firm* — Cowan, Liebowitz & Latman, P.C.

(57) ABSTRACT

An electronic device includes a first module, a second module located in a post-stage of the first module, and a third module located in a post-stage of the second module. The first module includes a determination unit that determines whether or not a predetermined condition is satisfied in a first state where a communication unit of the first module and a communication unit of the second module are electrically connected to each other and the communication unit of the second module and a communication unit of the third module are electrically separated from each other by a first switch, and a notification unit that performs a predetermined notification based on a determination result as to whether the predetermined condition is satisfied.

11 Claims, 10 Drawing Sheets

(51) Int. Cl.
*G06F 1/3287* (2019.01)
*G06F 1/3209* (2019.01)
*G06F 13/42* (2006.01)
*G06F 1/18* (2006.01)
*G06F 13/00* (2006.01)
*H05K 7/02* (2006.01)

(52) U.S. Cl.
CPC .......... *G06F 1/3209* (2013.01); *G06F 1/3287* (2013.01); *G06F 13/00* (2013.01); *G06F 13/4291* (2013.01); *H05K 7/023* (2013.01)

(56) References Cited

FOREIGN PATENT DOCUMENTS

| | | | |
|---|---|---|---|
| JP | 2003-163674 A | | 6/2003 |
| JP | 2016-071480 A | | 5/2016 |
| JP | 2016071480 A | * | 5/2016 |
| JP | 2017-005364 A | | 1/2017 |
| JP | 2017005364 A | * | 1/2017 |
| WO | 2006/043547 A1 | | 4/2006 |

OTHER PUBLICATIONS

The above foreign patent documents were cited in the Jun. 25, 2019 Japanese Office Action, which is unclosed without an English Translation, that issued in Japanese Patent Application No. 2017108362.

* cited by examiner

ELECTRONIC DEVICE AND METHOD OF CONTROLLING THE SAME

BACKGROUND

Field of the Invention

Aspects of the disclosure generally relate to an electronic device including modules and a method of controlling the same.

Description of the Related Art

In an electronic device formed of modules, the entire electronic device is controlled by communication between an integrated circuit (IC) of a master module and ICs of slave modules. As a specification for communication between ICs. Inter-Integrated Circuit (hereinafter called "I2C" or "I²C") specification is known. In I2C communication that is communication based on the I2C specification, communication is performed via a serial clock line SCL and a serial data line SDA that are signal lines for the I2C communication. The rising time and the falling time of transmission signals on I2C communication signal lines are defined by the I2C specification. On the other hand, International Publication No. WO2006/043547 discloses a method of adjusting the rising time of a transmission signal by changing pull-up resistors in accordance with an output device connected to a reproduction device.

On an I2C communication signal line, the rising time and the falling time of a transmission signal are susceptible to the resistance and the capacitance of the signal line. Thus, when many modules are connected in series, the rising time or the falling time of a transmission signal on an I2C communication signal line cannot meet conditions defined in the I2C specification, and there may be a case where connection cannot be established preferably. When pull-up resistors are changed as disclosed in International Publication No. WO2006/043547, this may lead to a more complex connection process or the like.

SUMMARY

According to an aspect of the embodiments, a device, a method, or a program of serving a connection of modules are provided.

According to an aspect of the embodiments, there is provided an electronic device including: a first module; a second module located in a post-stage of the first module; and a third module located in a post-stage of the second module, wherein the first module includes: a determination unit that determines whether or not a predetermined condition is satisfied in a first state where a communication unit of the first module and a communication unit of the second module are electrically connected to each other and the communication unit of the second module and a communication unit of the third module are electrically separated from each other by a first switch; and a notification unit that performs a predetermined notification based on a determination result as to whether the predetermined condition is satisfied.

According to an aspect of the embodiments, there is provided a method of controlling an electronic device, the electronic device including a first module, a second module located in a post-stage of the first module, and a third module located in a post-stage of the second module, the method including: determining whether or not a predetermined condition is satisfied in a first state where a communication unit of the first module and a communication unit of the second module are electrically connected to each other and the communication unit of the second module and a communication unit of the third module are electrically separated from each other by a first switch; and performing a predetermined notification based on a determination result as to whether the predetermined condition is satisfied.

According to an aspect of the embodiments, there is provided a non-transitory storage medium that stores a program causing a computer to execute a method of controlling an electronic device, the electronic device including a first module, a second module located in a post-stage of the first module, and a third module located in a post-stage of the second module, the method including: determining whether or not a predetermined condition is satisfied in a first state where a communication unit of the first module and a communication unit of the second module are electrically connected to each other and the communication unit of the second module and a communication unit of the third module are electrically separated from each other by a first switch; and performing a predetermined notification based on a determination result as to whether the predetermined condition is satisfied.

Further aspects of the embodiments will become apparent from the following embodiments.

DESCRIPTION OF THE EMBODIMENTS

Exemplary embodiments, features, and aspects of the disclosure will be described below with reference to the drawings. However, aspects of the disclosure are not limited to the following embodiments.

First Embodiment

Figure 1A:
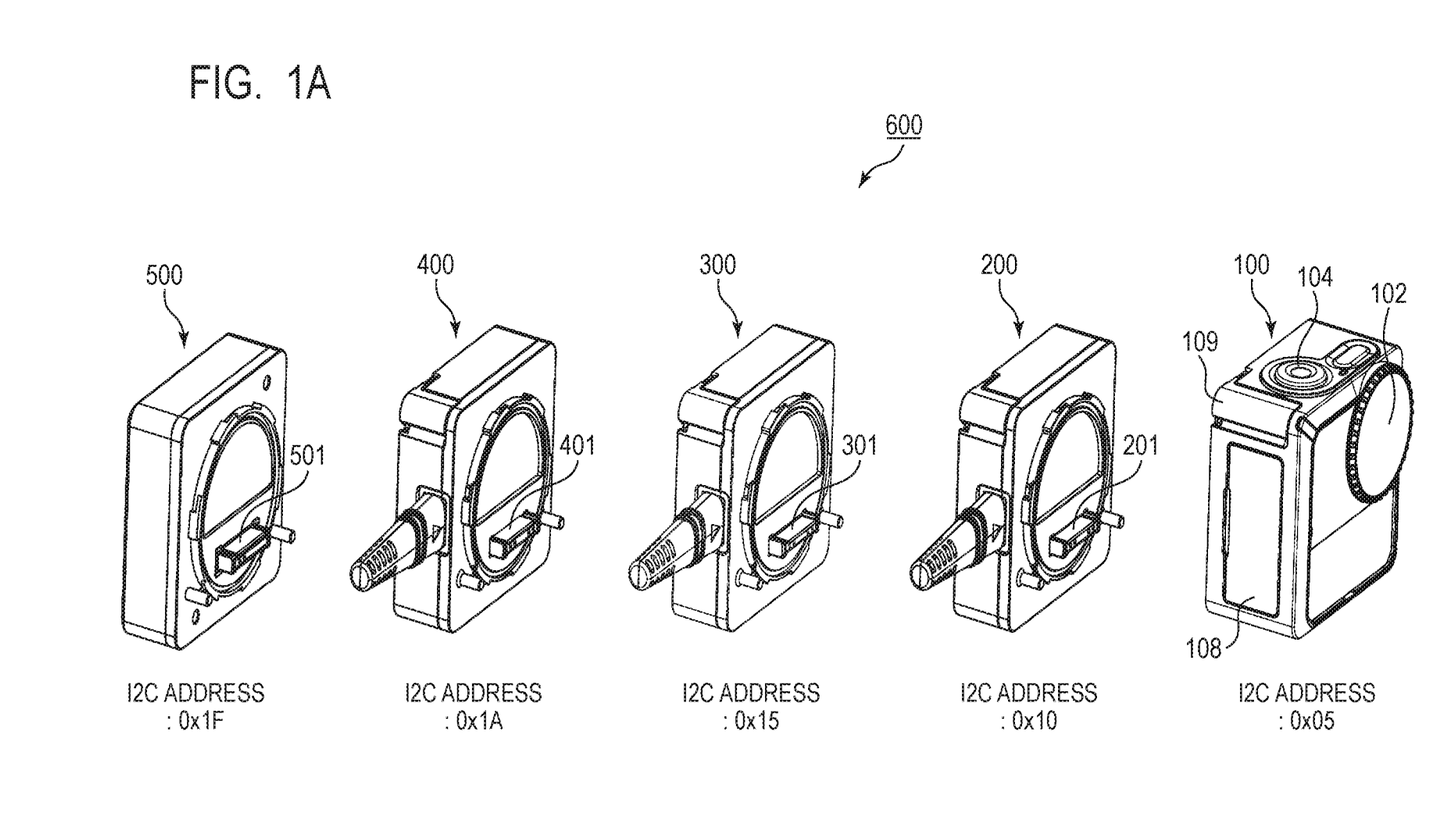
FIG. 1A and FIG. 1B are diagrams illustrating an example of modules included in an electronic device 600 of a first embodiment.
Figure 1B:
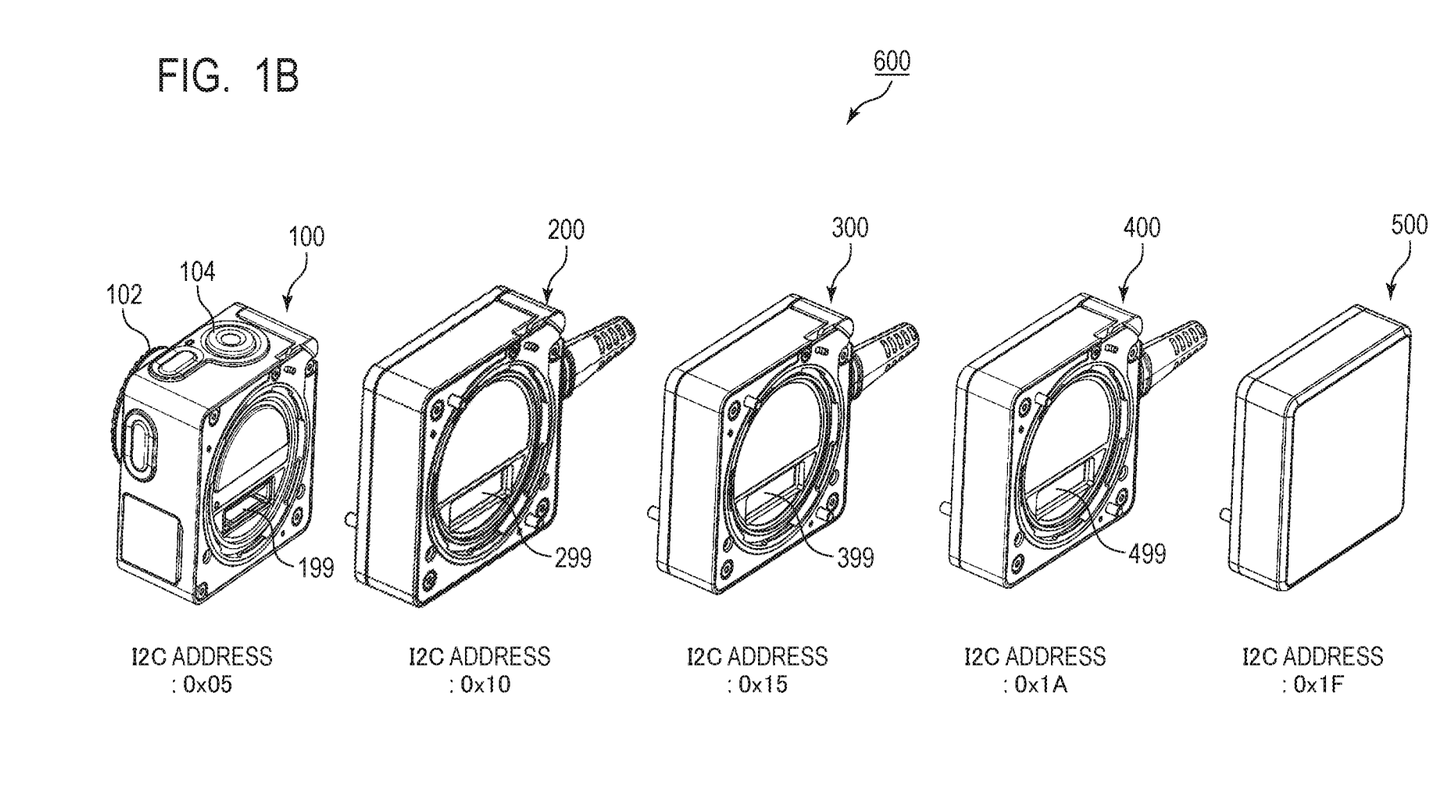

FIG. 1A and FIG. 1B are diagrams illustrating an example of modules included in an electronic device 600. While an example where the electronic device 600 is configured with five modules 100, 200, 300, 400, and 500 connected in series will be described in the first embodiment, the configuration of the electronic device 600 is not limited to such a configuration. In FIG. 1A and FIG. 1B, the modules 100, 200, 300, 400, and 500 are illustrated separated from each other. FIG. 1A is a perspective view of the modules 100, 200, 300, 400, and 500 separated from each other when viewed from one side. FIG. 1B is a perspective view of the modules 100, 200, 300, 400, and 500 separated from each other when viewed from the other side. The module 100 may be, for example, a camera module, and act, for example, as a master module. The modules 20X), 30X), and 400 may be, for example, modules each having a particular function, and act, for example, as slave modules. Each of the modules 200, 300, and 400 can be, for example, an input/output (I/O) module having a connector used for communication with an external device or a Near Field Communication (NFC) module that performs a short-range wireless communication. Further, each of the modules 200, 300, and 400 can be a communication module that wirelessly transmits and receives data to and from an external device, an image output module that outputs a digitized image, or a speaker module that outputs music or an operation sound. Further, each of the modules 200, 300, and 400 can be a microphone module for voice input, a storage module that can store a large volume of data, a display module that has a display device (e.g., a liquid crystal display device), a cooling unit that cools other modules, or the like. A user can connect the modules 200, 300, and 400 having desired functions to the module 100. The module 500 may be, for example, a power supply module, and act, for example, as a slave module. The connection of the modules 100, 200, 300, 400, and 500 is terminated at the module 500. Note that the connection order of the modules 100, 200, 300, 400, and 500 is not limited to the above. Note that, while a combination of modules is referred to as an electronic device here, an individual module may also be referred to as an electronic device. Further, an electronic device in which modules are combined may also be referred to as a communication system or referred to as an electronic system. Further, a module may also be referred to as a module device or referred to as an electronic device.

The module 100 is, for example, a camera module as described above. The module 100 has an image capture unit 102 that generates a digitized image from an optical image of a subject and an operating unit 104 that is a user interface used for operating the module 100. The operating unit 104 includes a power supply button used to connect or disconnect a power supply, a release button used to capture an optical image of a subject, or the like. Further, the module 100 has a jack cover portion 108 for protecting an input/output jack. With the jack cover portion 108 opened, various cables can be connected to the input/output jack. Further, the module 100 has a lock portion 109 for mechanically locking the post-stage modules 200, 300, 400, and 500 to the module 100. The lock portion 109 can be revolved and operated between a lock position and an unlock position. Setting the lock portion 109 to the unlock position allows the post-stage modules 200, 300, 400, and 500 to be removed from the module 100. The module 100 has a connector 199 for connecting the post-stage module 200.

The modules 200, 300, and 400 each have a particular function as described above. The module 200 has a connector 201 for connecting itself to the module 100, which is connected in the pre-stage of the module 200, and a connector 299 for connecting itself to the module 300, which is connected in the post-stage of the module 200. The module 300 has a connector 301 for connecting itself to the module 200, which is connected in the pre-stage of the module 300, and a connector 399 for connecting itself to the module 400, which is connected in the post-stage of the module 300. The module 400 has a connector 401 for connecting itself to the module 300, which is connected in the pre-stage of the module 400, and a connector 499 for connecting itself to the module 500, which is connected in the post-stage of the module 400.

The module 500 is a power supply module as described above. The module 500 has a connector 501 for connecting itself to the module 400, which is connected to the pre-stage of the module 500. As described above, the connection of the modules 100, 200, 300, 400, and 500 is terminated at the module 500. Therefore, the module 500 is structured so as to terminate the connection of the modules 100, 200, 300, 400, and 500.

Figure 2A:
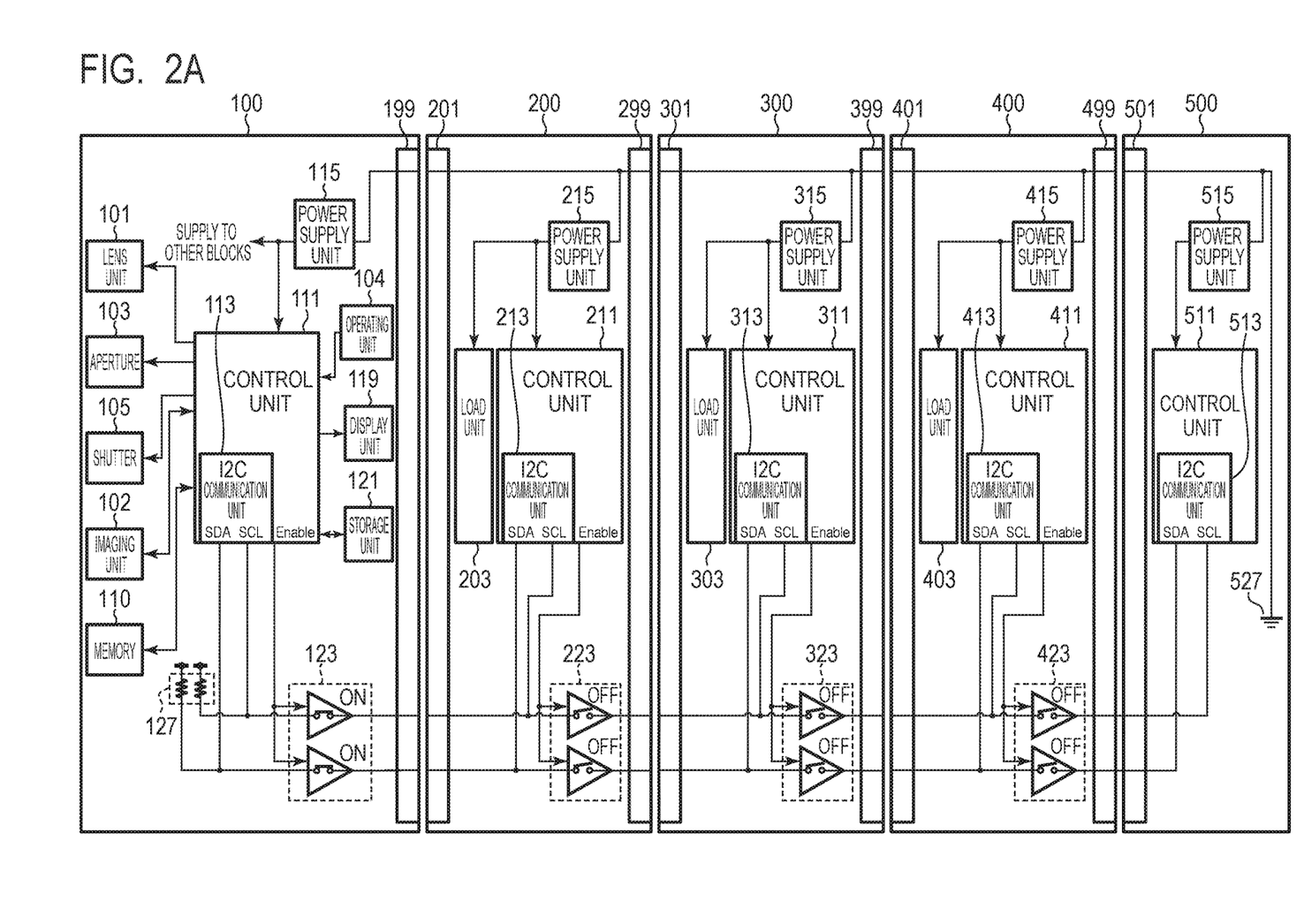
FIG. 2A, FIG. 2B, FIG. 2C, and FIG. 2D are block diagrams illustrating components of modules 100, 200, 300, 400, and 500.
Figure 2B:
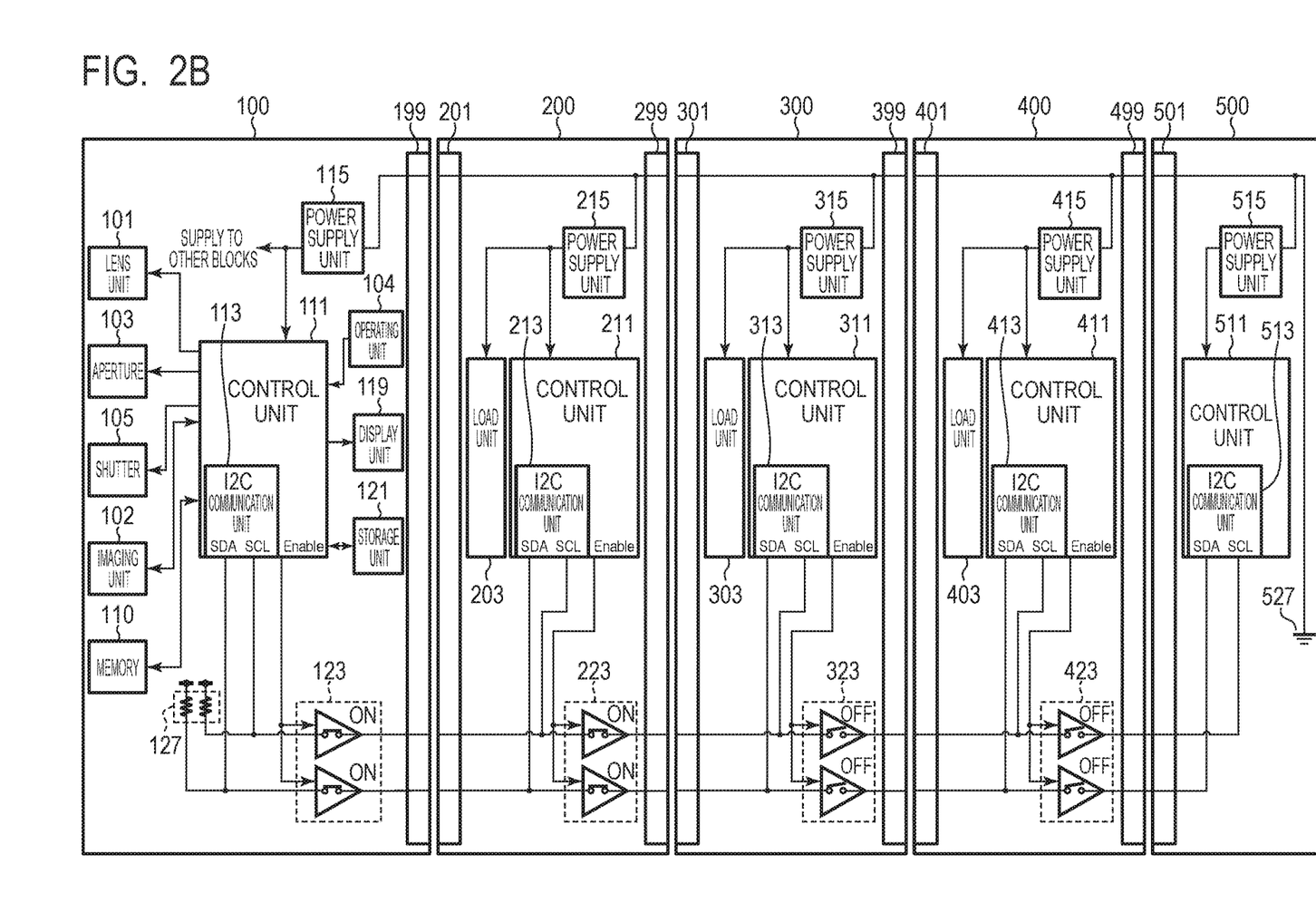
Figure 2C:
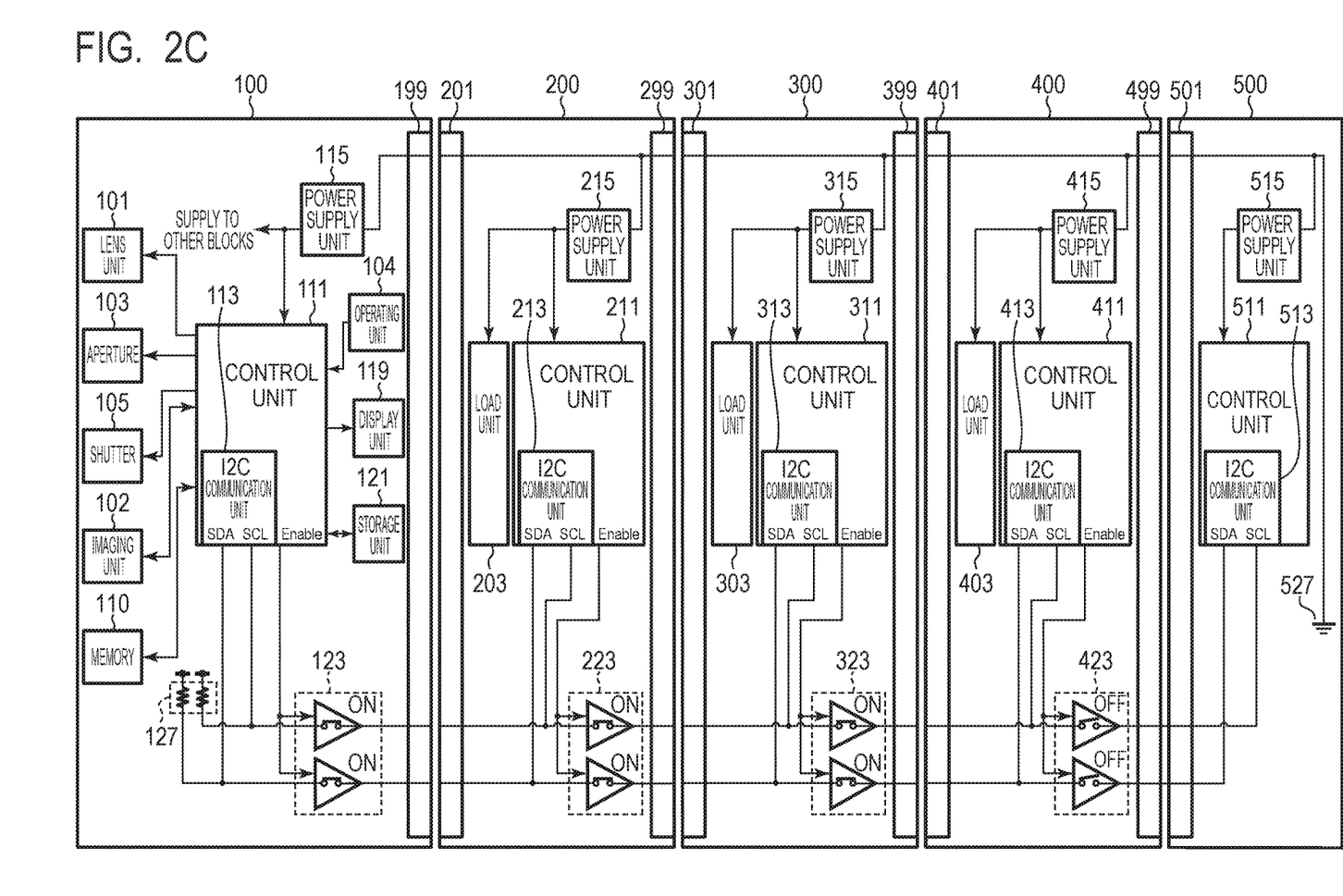
Figure 2D:
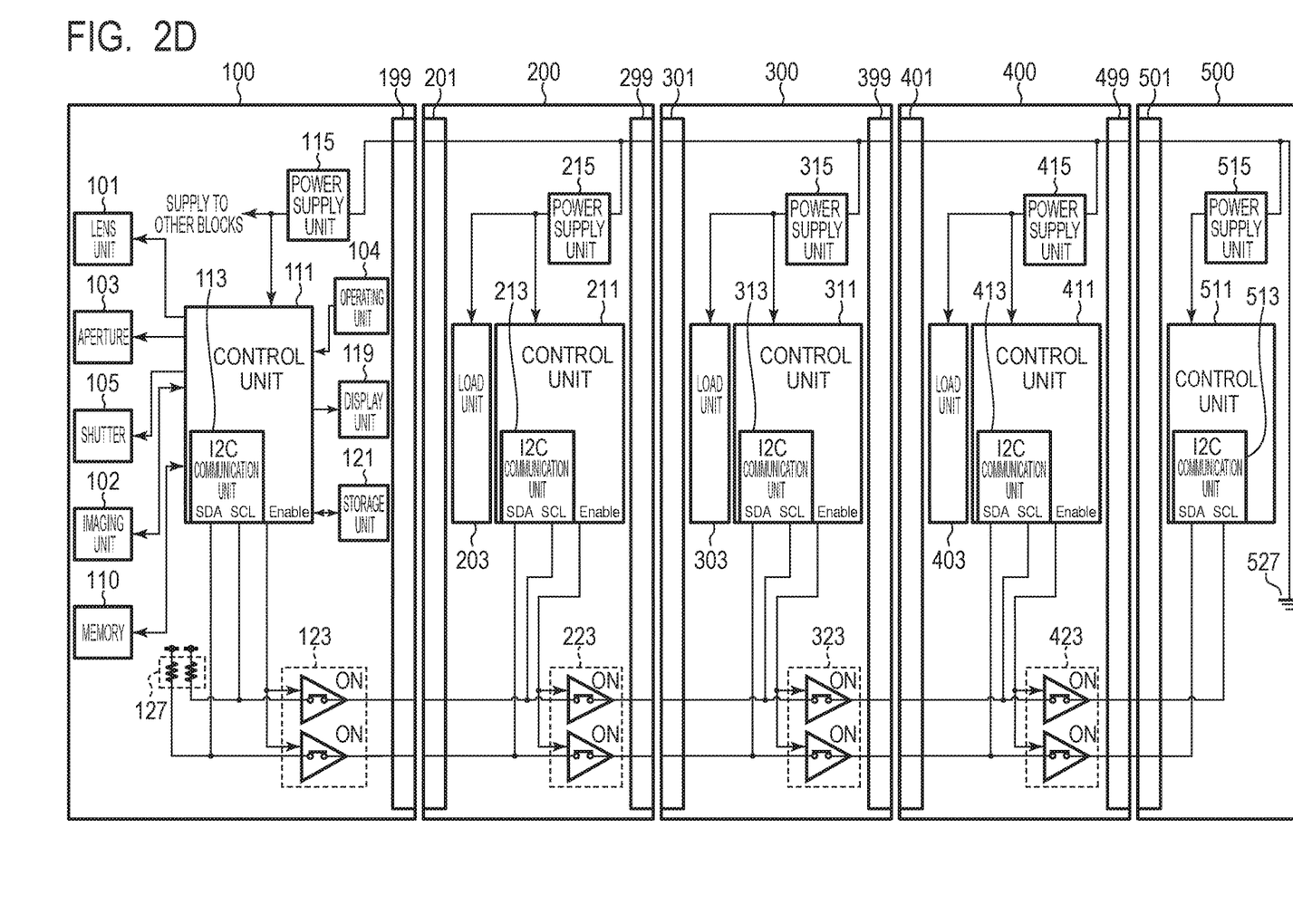

Next, components of the modules 100, 200, 300, 400, and 500 will be described with reference to FIG. 2A, FIG. 2B, FIG. 2C, and FIG. 2D. FIG. 2A illustrates a state where a switch 123 is in an ON state and a switch 223, a switch 323, and a switch 423 are in an OFF state. FIG. 2B illustrates a state where the switch 123 and the switch 223 are in an ON state and the switch 323 and the switch 423 are in an OFF state. FIG. 2C illustrates a state where the switch 123, the switch 223, and the switch 323 are in an ON state and the switch 423 is in an OFF state. FIG. 2D illustrates a state where all of the switch 123, the switch 223, the switch 323, and the switch 423 are in an ON state.

As illustrated in FIG. 2A, the module 100 has the lens unit 101, the image capture unit 102, an aperture 103, the operation unit 104, a shutter 105, a memory 110, a control unit 111, a power supply unit 115, a display unit 119, and a storage unit 121. The module 100 further has a switch 123 and a pull-up resistor 127. The lens unit 101 guides an optical image of a subject to the imaging surface of the image capture unit 102. The image capture unit 102 captures the optical image of the subject and generates a digitized image from the optical image. The aperture 103 adjusts an amount of a light reaching the imaging surface of the image capture unit 102. The shutter 105 controls the time of incidence of a light reaching the imaging surface of the image capture unit 102. The memory 110 may be used as a working area of the control unit 111. Various pieces of setting information of the electronic device 600 are stored in the memory 110. Count values in accordance with the rising time of transmissions signals of the serial clock line SCL and the serial data line SDA are stored in the memory 110. The control unit 111 has a memory device that stores a program used for controlling various components of the module 100 and a processor (e.g., a hardware processor) that controls various components of the module 100 by executing the program stored in the memory device. This enables the control unit 111 to control the imaging optical system including the lens unit 101, the aperture 103, and the shutter 105. The control unit 111 may control the image processing system including the image capture unit 102. The control unit 111 further controls the switch 123 connected to the serial clock line SCL and the serial data line SDA, respectively. The control unit 111 further has an I2C communication unit 113. The I2C communication unit 113 communicates with I2C communication units 213, 313, 413, and 513 of other modules 200, 300, 400, and 500. Specifically, the I2C communication unit 113 communicates with the I2C communication units 213, 313, 413, and 513 via I2C signal lines connecting other modules 200, 300, 400, and 500 in series. More specifically, the I2C communication unit 113 can perform I2C communication with the I2C communication units 213, 313, 413, and 513 of other modules 200, 300, 400, and 500, respectively, via the serial clock line SCL and the serial data line SDA. The I2C communication unit 113 of the module 100 is a master, and all the I2C communication units 213, 313, 413, and 513 of the other modules 200, 300, 400, and 500 are slaves. The I2C address of the module 100 is 0x05, for example. The I2C communication unit 113 determines whether or not a predetermined condition is satisfied in the following state. The state is a state where the I2C communication unit 113 and the I2C communication unit 213 of the module 200 are electrically connected via the signal line and the I2C communication unit 213 of the module 200 and the I2C communication unit 313 of the module 300 are electrically separated by the switch 223 described later. The I2C communication unit 113 determines whether or not the predetermined condition is satisfied in the following state. The state is a state where the I2C communication unit 113 and the I2C communication unit 313 of the module 300 are electrically connected via the signal line and the I2C communication unit 313 of the module 300 and the I2C communication unit 413 of the module 400 are electrically separated by the switch 323 described later. The I2C communication unit 113 further determines whether or not the predetermined condition is satisfied in the following state. The state is a state where the I2C communication unit 113 and the I2C communication unit 413 of the module 400 are electrically connected via the signal line and the I2C communication unit 413 of the module 400 and the I2C communication unit 513 of the module 500 are electrically separated by the switch 423 described later. The power supply unit 115 supplies power to each component of the module 100. Such power is supplied from the power supply unit 115 to the control unit 111 and the pull-up resistor 127 described later. On the display unit 119, a live view image, a reproduced image, a state of the electronic device 600, or the like may be displayed. Notification information issued when no I2C communication is established or the like may be displayed on the display unit 119. The storage unit 121 stores an image acquired by image capturing. The storage unit 121 may be a storage medium embedded in the module 100 or may be a storage medium or the like that is removable from the module 100. The switch 123 is connected to the serial clock line SCL and the serial data line SDA. In the state illustrated in FIG. 2A, since the switch 123 is in an ON state, the I2C communication signal line of the module 100 is electrically connected to the I2C communication signal line of the module 200 connected in the post-stage of the module 100. One end of the pull-up resistor 127 is connected to the power supply unit 115. The other end of the pull-up resistor 127 is connected to the serial clock line SCL and the serial data line SDA, respectively. The connector 199 is connected to the connector 201 of the module 200 connected in the post-stage of the module 100.

The module 200 has a load unit 203, a control unit 211, a power supply unit 215, and the switch 223. The load unit 203 is for implementing a function of the module 200. The load unit 203 is an I/O function unit used for communicating with an external device, for example, without being limited thereto. The control unit 211 has a memory device that stores a program used for controlling various components of the module 200 and a processor (e.g., a hardware processor) that controls various components of the module 200 by executing the program stored in the memory device. This enables the control unit 211 to control the load unit 203. The control unit 211 may further control the switch 223 connected to the serial clock line SCL and the serial data line SDA, respectively. The control unit 211 further has an I2C communication unit 213. The I2C communication unit 213 is for communicating with the I2C communication units 113, 313, 413, and 513 of other modules 100, 300, 400, and 500 and may perform communication via the serial clock line SCL and the serial data line SDA. Note that the I2C address of the module 200 is 0x10, for example. The power supply unit 215 supplies power to each component of the module 200. Such power is supplied from the power supply unit 215 to the control unit 211 and the load unit 203. The switch 223 is connected to the serial clock line SCL and the serial data line SDA that are signal lines for I2C communication. In the state illustrated in FIG. 2A, since the switch 223 is in an OFF state, the I2C communication signal line of the module 200 is electrically separated from the I2C communication single line of the module 300 connected in the post-stage of the module 200. The connector 299 is connected to the connector 301 of the module 300 connected in the post-stage of the module 200.

The module 300 has a load unit 303, a control unit 311, a power supply unit 315, and the switch 323. The load unit 303 is for implementing a function of the module 300. The load unit 303 is a communication function unit that transmits and receives data to and from an external device through wireless communication, for example, without being limited thereto. The control unit 311 has a memory device that stores a program used for controlling various components of the module 300 and a processor (e.g., a hardware processor) that controls various components of the module 300 by executing the program stored in the memory device. This enables the control unit 311 to control the load unit 303. The control unit 311 may further control the switch 323 connected to the serial clock line SCL and the serial data line SDA, respectively. The control unit 311 further has an I2C communication unit 313. The I2C communication unit 313 is for communicating with the I2C communication units 113, 213, 413, and 513 of other modules 100, 200, 400, and 500 and may perform communication via the serial clock line SCL and the serial data line SDA. Note that the I2C address of the module 300 is 0x15, for example. The power supply unit 315 supplies power to each component of the module 300. Such power is supplied from the power supply unit 315 to the control unit 311 and the load unit 303. The switch 323 is connected to the serial clock line SCL and the serial data line SDA. In the state illustrated in FIG. 2A, since the switch 323 is in an OFF state, the I2C communication signal line of the module 300 is electrically separated from the I2C communication signal line of the module 400 connected in the post-stage of the module 300. The connector 399 is connected to the connector 401 of the module 400 connected in the post-stage of the module 300.

The module 400 has a load unit 403, a control unit 411, a power supply unit 415, and the switch 423. The load unit 403 is for implementing a function of the module 400. The load unit 403 is a function unit that externally outputs a digitized image and voice, for example, without being limited thereto. The control unit 411 has a memory device that stores a program used for controlling various components of the module 400 and a processor (e.g., a hardware processor) that controls various components of the module 400 by executing the program stored in the memory device. This enables the control unit 411 to control the load unit 403. The control unit 411 may further control the switch 423 connected to the serial clock line SCL and the serial data line SDA, respectively. The control unit 411 further has an I2C communication unit 413. The I2C communication unit 413 is for communicating with the I2C communication units 113, 213, 313, and 513 of other modules 100, 200, 300, and 500 and may perform communication via the serial clock line SCL and the serial data line SDA. Note that the I2C address of the module 400 is 0x1A, for example. The power supply unit 415 supplies power to each component of the module 400. Such power is supplied from the power supply unit 415 to the control unit 411 and the load unit 403. The switch 423 is connected to the serial clock line SCL and the serial data line SDA. In the state illustrated in FIG. 2A, since the switch 423 is in an OFF state, the I2C communication signal line of the module 400 is electrically separated from the I2C communication signal line of the module 500 connected in the post-stage of the module 400. The connector 499 is connected to the connector 501 of the module 500 connected in the post-stage of the module 400.

The module 500 has a control unit 511 and power supply unit 515. The control unit 511 has a memory device that stores a program used for controlling various components of the module 500 and a processor (e.g., a hardware processor) that controls various components of the module 500 by executing the program stored in the memory device. The control unit 511 further has an I2C communication unit 513. The I2C communication unit 513 is for communicating with the I2C communication units 113, 213, 313, and 413 of other modules 100, 200, 300, and 400 and may perform communication via the serial clock line SCL and the serial data line SDA. Note that the I2C address of the module 500 is 0x1F, for example. The power supply unit 515 supplies power to each component of the module 500. Such power is supplied from the power supply unit 515 to the control unit 511. The ground terminal of the power supply unit 515 is connected to a ground line connected to a ground potential 527. The ground terminals of the power supply units 115, 215, 315, 415, and 515 are connected to each other through the ground line. Note that the module 500 is structured such that no other module is connected to the post-stage of the module 500.

Figure 3:
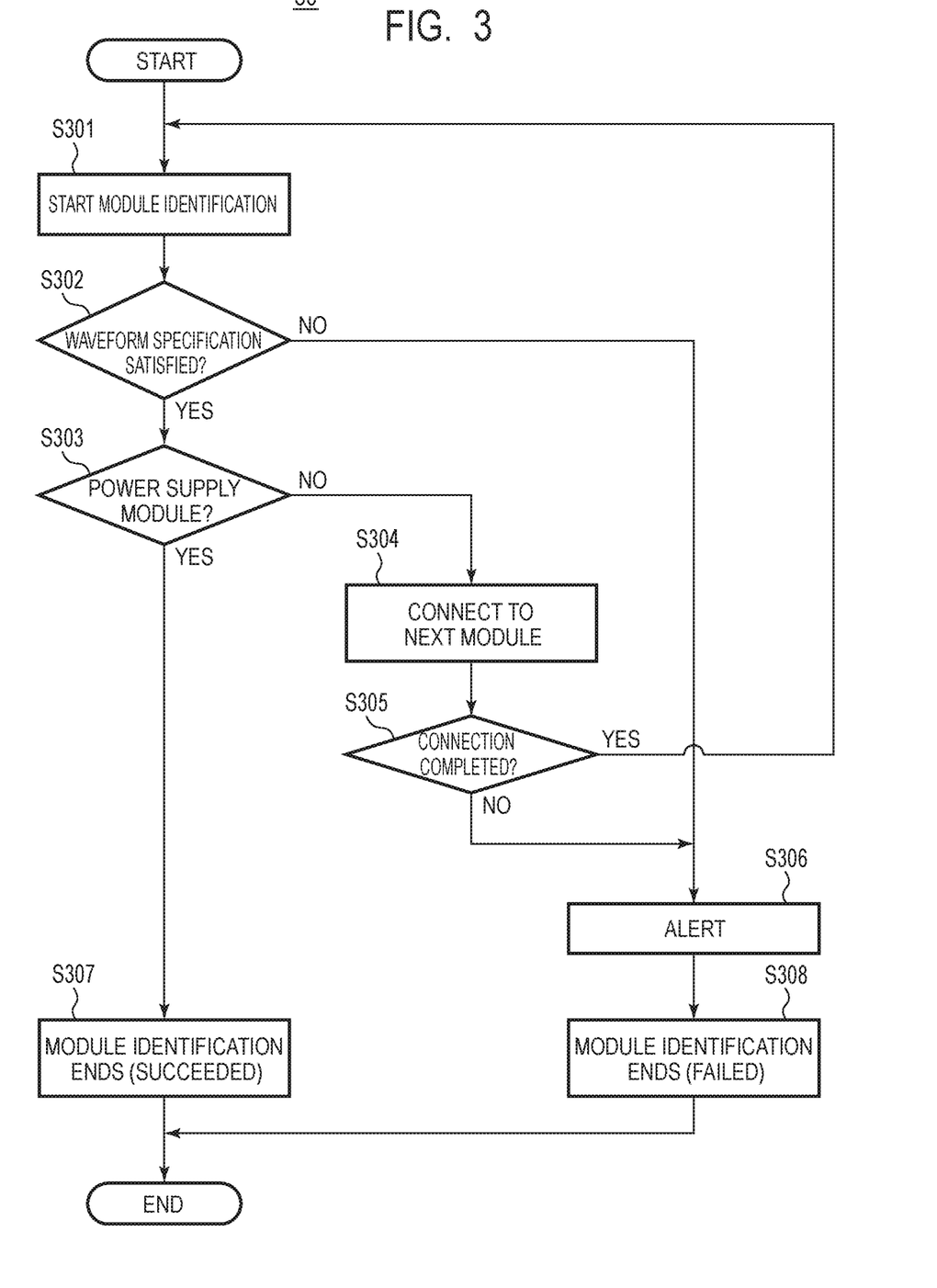
FIG. 3 is a flowchart illustrating an operation example of the electronic device 600 of the first embodiment.

Next, an operation example of the electronic device 600 will be described with reference to a flowchart of FIG. 3. FIG. 3 illustrates a process 30 of identifying a module performed when the electronic device 600 starts up.

In step S301, the module 100 starts identifying a module connected to the post-stage of the module 100. Identification of modules is sequentially performed starting from a module located closer to the module 100 that is a master module. Therefore, first, identification of the module 200 is performed. The identification of the module 200 is performed in a state where the I2C communication unit 213 of the module 200 is electrically connected to the I2C communication unit 113 of the module 100 via the serial clock line SCL and the serial data line SDA. In this case, the I2C communication units 313, 413, and 513 are electrically separated from the I2C communication units 113 and 213 by the switch 223 of the module 200. Identification of a module is performed by incrementing the I2C address until a response from the module is obtained. As described above, the address of the module 200 is 0x10, for example. Therefore, when the I2C address has been incremented up to 0x10, the module 100 obtains a response from the module 200. Accordingly, the module 200 is identified.

In step S302, the I2C communication unit 113 of the module 100 determines whether or not delay time on an I2C communication signal line satisfies a predetermined condition defined in the I2C specification. The predetermined condition is a condition that delay of a signal on an I2C communication signal line is less than a predetermined time, for example. The I2C communication unit 113 determines whether or not the delay time on the serial clock line SCL and the serial data line SDA satisfies such a predetermined condition. Specifically, the I2C communication unit 113 counts the rising time of transmission signals on the serial clock line SCL and the serial data line SDA. Based on whether or not the count value is less than a specification value (threshold), the I2C communication unit 113 then determines whether or not the delay time on the serial clock line SCL and the serial data line SDA satisfies the I2C specification.

Figure 4:
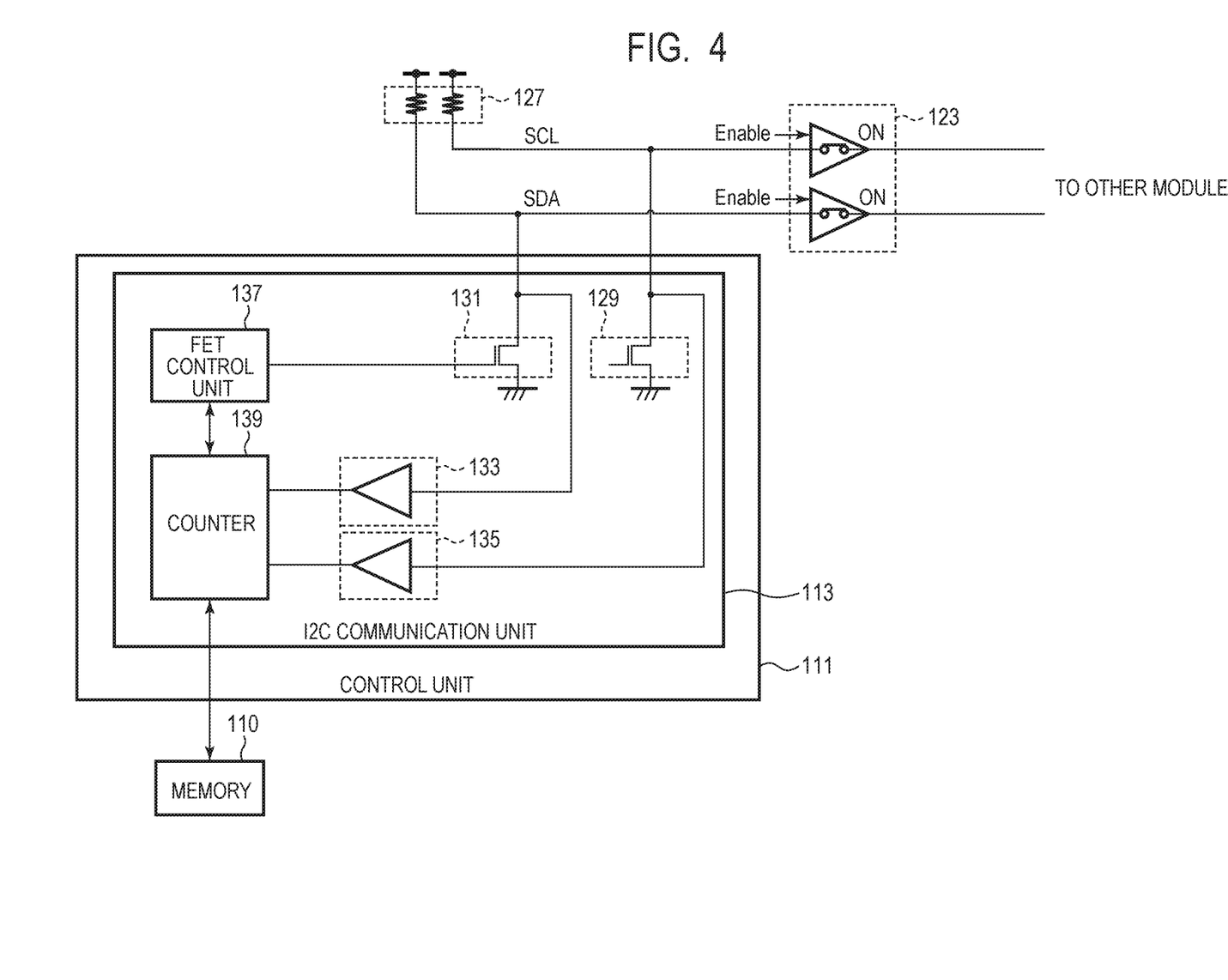
FIG. 4 is a block diagram illustrating a configuration example of an I2C communication unit 113.

A configuration example of the I2C communication unit 113 will be described with reference to FIG. 4. The I2C communication unit 113 has Field Effect Transistors (FETs) 129 and 131. The sources of the FETs 129 and 131 are connected to the ground line, respectively. The drain of the FET 129 is connected to the serial clock line SCL. The drain of the FET 131 is connected to the serial data line SDA. Control signals output from an FET control unit 137 are applied to the gates of the FETs 129 and 131. The FET control unit 137 controls the FETs 129 and 131. When the FET control unit 137 applies a High level control signal to the gate of the FET 129, the FET 129 is turned on, and the serial clock line SCL is set to a Low level. When the FET control unit 137 applies a High level control signal to the gate of the FET 131, the FET 131 is turned on, and the serial data line SDA is set to a Low level. When the control signal supplied from the FET control unit 137 to the gate of the FET 129 is controlled to a Low level, the FET 129 is turned off, and the serial clock line SCL is transferred to a state not fixed to the Low level. When the control signal supplied from the FET control unit 137 to the gate of the FET 131 is controlled to a Low level, the FET 131 is turned off, and the serial data line SDA is transferred to a state not fixed to the Low level. The I2C communication unit 113 has a buffer 135 connected to the drain of the FET 129 and the serial clock line SCL. The I2C communication unit 113 further has a buffer 133 connected to the drain of the FET 131 and the serial data line SDA. Each output of the buffers 133 and 135 is input to the counter 139. The counter 139 can count the time taken for the serial clock line SCL and the serial data line SDA to change from a Low level to a High level, respectively. For example, the counter 139 can count a time period from the time when the FET control unit 137 causes the FET 129 to change from an ON state to an OFF state to the time when the output of buffer 135 changes from the Low level to the High level. Further, the counter 139 can count a time period from the time when the FET control unit 137 causes the FET 131 to change from an ON state to an OFF state to the time when the output of buffer 133 changes from the Low level to the High level.

Figure 5A:
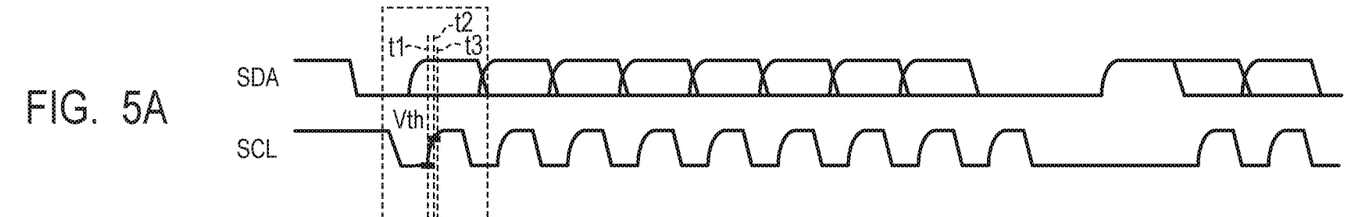
FIG. 5A, FIG. 5B, FIG. 5C, and FIG. 5D are time charts illustrating examples of transmission signals.

Examples of transmission signals will be described with reference to time charts of FIG. 5A to FIG. 5D. FIG. 5A to FIG. 5D illustrate examples of transmission signals on the serial clock line SCL and the serial data line SDA. FIG. 5A corresponds to the state of FIG. 2A, for example, and FIG. 5B corresponds to the state of FIG. 2D, for example. FIG. 5C illustrates an enlarged view of a portion surrounded by a rectangular of FIG. 5A, and FIG. 5D illustrates an enlarged view of a portion surrounded by a rectangular of FIG. 5B.

At a timing t1, the FET control unit 137 changes the FET 129 connected to the serial clock line SCL from an ON state to an OFF state and starts a counting process performed by the counter 139. Since the serial clock line SCL is pulled up via the pull-up resistor 127, the serial clock line SCL changes from the Low level to the High level in response to the change from the ON state to the OFF state of the FET 129. The time taken for the serial clock line SCL to change from the Low level to the High level is the time in accordance with the resistance and the capacitance of the serial clock line SCL and the resistance of the pull-up resistor 127. When the FET 129 is changed from the ON state to the OFF state, the time required for transition of the serial clock line SCL from the Low level to the High level is longer when the number of modules connected to the module 100 is larger. A threshold Vth illustrated in FIG. 5A to FIG. 5D is a potential of the serial clock line SCL when the output of the buffer 135 changes from the Low level to the High level. Upon the potential of the serial clock line SCL reaching the threshold Vth, the output of the buffer 135 changes from the Low level to the High level, and the counter 139 stops the counting process. The I2C communication unit 113 determines whether or not the delay time on the serial clock line SCL satisfies the specification value defined in the I2C specification. Specifically, the I2C communication unit 113 compares the count value obtained by the counter 139 with the count value in accordance with the specification value defined in the I2C specification. Note that the count value in accordance with the specification value defined in the I2C specification is stored in the memory 110 or the like, for example.

If the delay time on the I2C communication signal line satisfies the I2C specification (step S302, YES), the process 30 advances to step S303. On the other hand, if the delay time on the I2C communication signal line does not satisfy the I2C specification (step S302, NO), the process 30 advances to step S306. In the state illustrated in FIG. 2A, the potential of the serial clock line SCL reaches the threshold Vth at the timing t2, as illustrated in FIG. 5A and FIG. 5C. The time period from the timing t1 to the timing t2 is less than the delay time defined in the I2C specification. Therefore, in the case of the state illustrated in FIG. 2A, the process 30 advances to step S303.

In step S303, the I2C communication unit 113 identifies whether or not the detected module is the power supply module 500. Such identification is performed through the I2C communication. The address of the power supply module 500 is, for example, 0x1F as described above. Therefore, the determination whether or not the detected module is the power supply module 500 may be made based on whether or not the address of the detected module is 0x1F. Note that the reason for determining whether or not the detected module is the power supply module 500 is that, since the specification defines connection of modules to be terminated at the power supply module 500, it is unnecessary to detect a further module. Note that information such as a power supply voltage value, a remaining battery level, a deterioration degree, or the like may be acquired from the power supply module 500. If the detected module is the power supply module 500 (step S303, YES), the process 30 advances to step S307. On the other hand, if the detected module is not the power supply module 500 (step S303, NO), the process 30 advances to step S304.

In step S304, the control unit 111 of the module 100 performs control so that the I2C communication unit of the next module is connected to the I2C communication unit 113 via the I2C communication signal line. For example, when there is a state illustrated in FIG. 2A, the I2C communication unit 113 performs control to have the state illustrated in FIG. 2B. Specifically, in order to identify the module 300 connected to the post-stage of the module 200, the control unit 111 of the module 100 issues an instruction so that the switch 223 of the module 200 is turned on. Such an instruction is transmitted to the control unit 211 of the module 200 through the I2C communication, for example. When the control unit 211 of the module 200 turns on the switch 223, the module 100 can identify the module 300 connected to the post-stage of the module 200.

In step S305, the control unit 111 of the module 100 inquires of the module 200 as to whether or not a process for connecting the next module is completed. Specifically, the module 100 inquires of the control unit 211 of the module 200 through the I2C communication, for example, as to whether or not a process of turning on the switch 223 of the module 200 is completed. If the process for connecting the next module is completed, the process 30 returns to step S301. If the process for connecting the next module is not completed and connection of the next module is not possible (step S305, NO), the process 30 advances to step S306. When the next module is the module 30X), the state illustrated in FIG. 2A is transferred to the state illustrated in FIG. 2B. In the state illustrated in FIG. 2B, the switch 123 of the module 100 and the switch 223 of the module 200 are in the ON state. Thus, the I2C communication signal lines of the modules 100, 200, and 300 have been connected to each other. When the next module is the module 400, the state illustrated in FIG. 2B is transferred to the state illustrated in FIG. 2C. In the state illustrated in FIG. 2C, the switch 123 of the module 100, the switch 223 of the module 200, and the switch 323 of the module 300 are in the ON state. Thus, the I2C communication signal lines of the modules 100, 200, 300, and 400 have been connected to each other. When the next module is the module 500, the state illustrated in FIG. 2C is transferred to the state illustrated in FIG. 2D. In the state illustrated in FIG. 2D, the switch 123 of the module 100, the switch 223 of the module 200, the switch 323 of the module 300), the switch 423 of the module 400 are in the ON state. Thus, the I2C communication signal lines of the modules 100, 200, 300, 400, and 500 have been connected to each other. The processes on and after step S301 are then repeated in the same manner as described above.

Figure 5B:
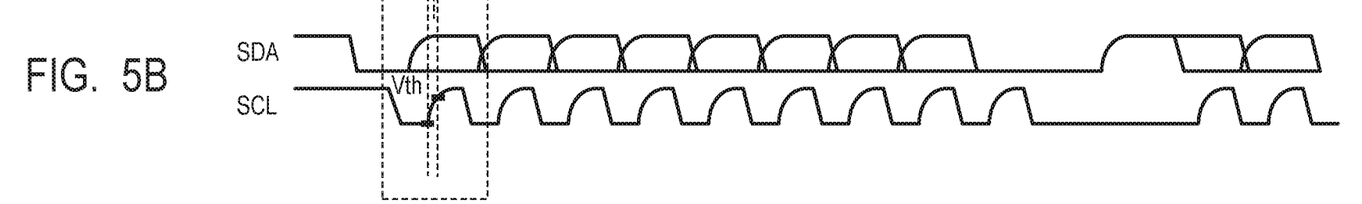
Figure 5C:
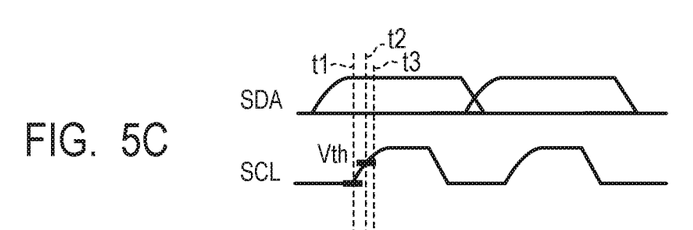
Figure 5D:
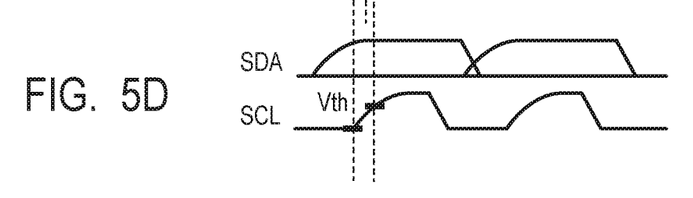

In the state illustrated in FIG. 2D, the potential of the serial clock line SCL reaches the threshold Vth at a timing t3, as illustrated in FIG. 5B and FIG. 5D. In the state illustrated in FIG. 2D, the reason why the required time for the potential of the serial clock line SCL to reach the threshold Vth is longer than that in the case illustrated in FIG. 2A is that the resistance and the capacitance of the serial clock line SCL have increased due to the increase in the number of connected modules. The time from the timing t1 to the timing t3 is longer than or equal to the delay time defined in the I2C specification, for example. Therefore, in the case of the state illustrated in FIG. 2D, the delay time on the I2C communication signal line does not satisfy the I2C specification (step S302, NO), the process 30 advances to step S306.

Figure 6A:
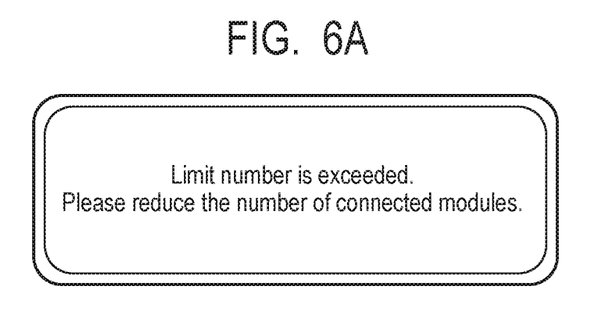
FIG. 6A, FIG. 6B, and FIG. 6C are diagrams illustrating examples of predetermined notifications performed in the electronic device 600.

In step S306, the control unit 111 of the module 100 performs a predetermined alert (notification) by using the display unit 119. Examples of predetermined notifications performed in the electronic device 600 will be described with reference to FIG. 6A to FIG. 6C. For example, if the delay time on the I2C communication signal line does not satisfy the I2C specification, the control unit 111 performs a notification for prompting the user to reduce the number of modules connected in series. For example, as illustrated in FIG. 6A, the control unit 111 displays notification information such as "Limited number is exceeded. Please reduce the number of connected modules" on the display unit 119. The process 30 then advances to step S308.

In step S308, the control unit 111 of the module 100 ends the identification of a module (identification failed).

In step S307, the control unit 111 of the module 100 ends the identification of a module (identification succeeded). Then, image capturing or the like by using the electronic device 600 is performed based on the user operation or the like.

Figure 6B:
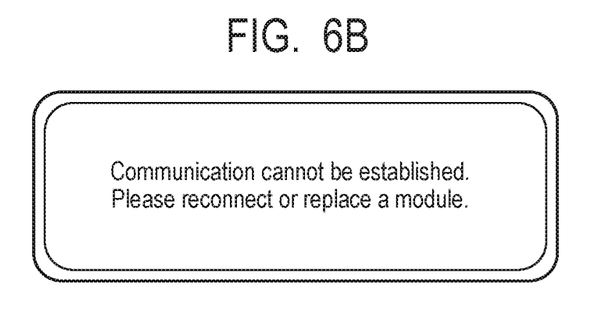
Figure 6C:
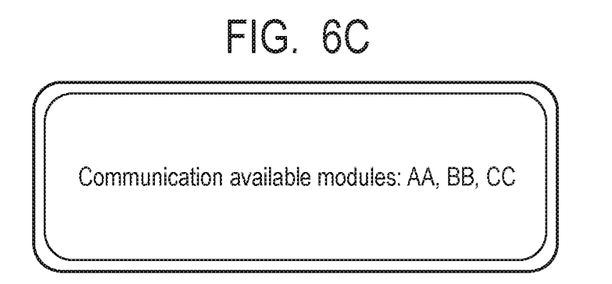

Note that, while the case where it is determined whether or not the delay time on the I2C communication signal line satisfies the I2C specification and indication in accordance with the determination result is displayed on the display unit 119 has been described here as an example, the embodiment is not limited thereto. For example, when communication cannot be established with any of the modules, the control unit 111 may use the display unit 119 to perform display indicating that communication cannot be established. Furthermore, the control unit 111 may use the display unit 119 to perform display prompting reconnection of the module or replacement of the module. For example, as illustrated in FIG. 6B, the control unit 111 may use the display unit 119 to display notification information such as "Communication cannot be established. Please reconnect or replace a module." In this case, the control unit 111 may display, on the display unit 119, information indicating a module which is unavailable for communication. Further, the control unit 111 may use the display unit 119 to display a list of modules which is available for communication. For example, as illustrated in FIG. 6C, the display unit 119 may be used to display notification information such as "Communication available modules: AA, BB, CC."

As discussed above, according to the first embodiment, it is determined whether or not a predetermined condition is satisfied in a state where the module 300 located in the post-stage of the module 200 is electrically separated by the switch 223 of the module 200. Further, it is determined whether or not the predetermined condition is satisfied in a state where the module 400 located in the post-stage of the module 300 is electrically separated by the switch 323 of the module 300. Further, it is determined whether or not the predetermined condition is satisfied in a state where the module 500 located in the post-stage of the module 400 is electrically separated by the switch 423 of the module 400. Alert information based on the determination results is then notified to the user. Thus, according to the first embodiment, it is possible to perform good connection of modules without causing complication of the connection process or the like.

Note that, in the first embodiment, while the case where the display unit 119 is used to display an alert or the like has been described as an example, the embodiment is not limited thereto, and an alert may be notified by using voice or the like.

Further, in the first embodiment, while the case where a notification is performed by using the display unit 119 of the module 100 has been described as an example, the embodiment is not limited thereto. For example, a predetermined notification may be performed by a module different from the module 100, such as a display unit of the module 200.

Second Embodiment

Various functions, processes, or methods described in the first embodiment can be implemented by a personal computer, a microcomputer, a central processing unit (CPU), a processor, or the like by using a program. In the second embodiment, a personal computer, a microcomputer, a CPU, a processor, or the like is referred to as "computer X". Further, in the second embodiment, a program that controls the computer X and implements various functions, processes, or methods described in the first embodiment is referred to as "program Y".

Various functions, processes, or methods described in the first embodiment are implemented by the computer X executing the program Y. In this case, the program Y is supplied to the computer X via a computer readable storage medium. A computer readable storage medium in the second embodiment includes at least one of a hard disk device, a magnetic storage device, an optical storage device, a magneto-optical storage device, a memory card, a volatile memory device, a non-volatile memory device, or the like. The computer readable storage medium in the second embodiment is a non-transitory storage medium.

While aspects of the disclosure are described with reference to exemplary embodiments, it is to be understood that the aspects of the disclosure are not limited to the exemplary embodiments. The scope of the following claims is to be accorded the broadest interpretation so as to encompass all modifications and equivalent structures.

This application claims priority from Japanese Patent Application No. 2017-108362, filed on May 31, 2017, which is hereby incorporated by reference herein in its entirety.

What is claimed is:

1. An electronic device comprising:
   modules including a first module, a second module, and a third module,
   wherein the second module is located in a post-stage of the first module or one of the modules,
   wherein the third module is located in a post-stage of the second module, and
   wherein the first module includes:
   a determination unit that determines whether or not a delay time on a serial clock line satisfies Inter-Integrated Circuit specification, in a case where a communication unit of the first module and a communication unit of the second module are electrically connected to each other via the serial clock line and the communication unit of the second module and a communication unit of the third module are electrically separated from each other by a switch of the second module; and
   a notification unit that performs a notification that prompts a user to reduce a module from the electronic device, in a case where the determination unit determines that the delay time on the serial clock line does not satisfy Inter-Integrated Circuit specification.

2. The electronic device according to claim 1, wherein the notification unit includes a display device.

3. The electronic device according to claim 1, wherein the notification unit performs a notification indicating that communication cannot be established, in a case where communication with one of the modules cannot be established.

4. The electronic device according to claim 1, wherein the notification unit performs a notification that prompts an user to reconnect or replace a module, in a case where communication with one of the modules cannot be established.

5. A method of controlling an electronic device, the electronic device including modules that includes a first module, a second module located in a post-stage of the first module or one of the modules, and a third module located in a post-stage of the second module, the method comprising:
   causing a determination unit of the first module to determine whether or not a delay time on a serial clock line satisfies Inter-Integrated Circuit specification, in a case where a communication unit of the first module and a communication unit of the second module are electrically connected to each other via the serial clock line and the communication unit of the second module and a communication unit of the third module are electrically separated from each other by a switch of the second module; and
   causing a notification unit of the first module to perform a notification that prompts an user to reduce a module from the electronic device, in a case where the determination unit determines that the delay time on the serial clock line does not satisfy Inter-Integrated Circuit specification.

6. A non-transitory storage medium that stores a program causing a computer to execute a method of controlling an electronic device, the electronic device including modules that includes a first module, a second module located in a post-stage of the first module or one of the modules, and a third module located in a post-stage of the second module, the method comprising:

causing a determination unit of the first module to determine whether or not a delay time on a serial clock line satisfies Inter-Integrated Circuit specification, in a case where a communication unit of the first module and a communication unit of the second module are electrically connected to each other via the serial clock line and the communication unit of the second module and a communication unit of the third module are electrically separated from each other by a first switch of the second module; and causing a notification unit of the first module to perform a notification that prompts an user to reduce a module from the electronic device, in a case where the determination unit determines that the delay time on the serial clock line does not satisfy Inter-Integrated Circuit specification.

7. The electronic device according to claim 1, further comprising:

a control unit that controls the switch of the second module so that the communication unit of the second module and the communication unit of the third module are electrically connected to each other via the serial clock line, in a case where the determination unit determines that the delay time on the serial clock line satisfies Inter-Integrated Circuit specification.

8. The method according to claim 5, wherein the notification unit includes a display device.

9. The method according to claim 5, further comprising:
causing the notification unit to perform a notification indicating that communication cannot be established, in a case where communication with one of the modules cannot be established.

10. The method according to claim 5, further comprising:
causing the notification unit to perform a notification that prompts an user to reconnect or replace a module, in a case where communication with one of the modules cannot be established.

11. The method according to claim 5, further comprising:
causing a control unit of the first module to control the switch of the second module so that the communication unit of the second module and the communication unit of the third module are electrically connected to each other via the serial clock line, in a case where the determination unit determines that the delay time on the serial clock line satisfies Inter-Integrated Circuit specification.

* * * * *